(12) United States Patent
Buck et al.

(10) Patent No.: US 6,175,531 B1
(45) Date of Patent: Jan. 16, 2001

(54) DYNAMIC SEMICONDUCTOR MEMORY DEVICE AND METHOD FOR INITIALIZING A DYNAMIC SEMICONDUCTOR MEMORY DEVICE

(75) Inventors: Martin Buck, München; Helmut Fischer, Taufkirchen; Heinrich Hemmert, München; Bret Johnson, München; Sebastian Kuhne, München, all of (DE)

(73) Assignee: Siemens Aktiengesellschaft, Munich (DE)

( * ) Notice: Under 35 U.S.C. 154(b), the term of this patent shall be extended for 0 days.

(21) Appl. No.: 09/343,429

(22) Filed: Jun. 30, 1999

(30) Foreign Application Priority Data

Jun. 30, 1998 (DE) .............................. 198 29 288

(51) Int. Cl.$^7$ ...................................... G11C 7/00
(52) U.S. Cl. ........................................ 365/226; 365/227
(58) Field of Search .................. 365/226, 227, 365/228; 327/143, 198

(56) References Cited

U.S. PATENT DOCUMENTS

| | | | |
|---|---|---|---|
| 5,485,111 | 1/1996 | Tanimoto | ............................ 327/143 |
| 5,559,753 | 9/1996 | Kocis | .................................. 365/236 |
| 5,734,281 | * 3/1998 | Morishima et al. | ................. 365/226 |

FOREIGN PATENT DOCUMENTS

| | | |
|---|---|---|
| 0 640 981 A2 | 3/1995 | (EP) . |
| 9-106668 | 4/1997 | (JP) . |

* cited by examiner

*Primary Examiner*—Vu A. Le
(74) *Attorney, Agent, or Firm*—Herbert L. Lerner; Laurence A. Greenberg; Werner H. Stemer

(57) ABSTRACT

A dynamic semiconductor memory device of the random access type having an initialization circuit which controls the switch-on operation of the semiconductor memory device and of its circuit components. The initialization circuit supplies a supply voltage stable signal once the supply voltage has been stabilized after the switching-on of the semiconductor memory device. The initialization circuit has an advance detector circuit, which detects a predetermined level state of an externally applied clock control signal chronologically before the supply voltage stable signal is generated and, as a reaction to this, supplies a first enable signal for unlatching the control circuit provided for the proper operation of the semiconductor memory device.

19 Claims, 3 Drawing Sheets

DYNAMIC SEMICONDUCTOR MEMORY DEVICE AND METHOD FOR INITIALIZING A DYNAMIC SEMICONDUCTOR MEMORY DEVICE

BACKGROUND OF THE INVENTION

Field of the Invention

The invention relates to a dynamic semiconductor memory device of a random access type (DRAM/SDRAM) having an initialization circuit which controls a switch-on operation of the semiconductor memory device and of its circuit components and supplies a supply voltage stable signal (POWERON) once the supply voltage has been stabilized after the switch-on of the semiconductor memory device. The invention also relates to a method for initializing such a dynamic semiconductor memory device, and also to the use of an enable circuit, which supplies an enable signal, for controlling the switch-on operation of a dynamic semiconductor memory device.

In the case of SDRAM semiconductor memories according to the JEDEC standard, it is necessary to ensure during the switch-on operation ("POWERUP") that the internal control circuits provided for the proper operation of the semiconductor memory device are reliably held in a defined desired state, in order to prevent undesirable activation of output transistors that would cause, on the data lines, a short circuit (so-called "bus contention" or "data contention") or uncontrolled activation of internal current loads. The solution to the problem turns out to be difficult on account of a fundamental unpredictability of the time characteristic of the supply voltage and of the voltage level or levels at the external control inputs during the switch-on operation of the semiconductor memory. According to the specifications of the manufacturer, an SDRAM component should ignore all commands that are present chronologically before a defined initialization sequence. The sequence consists of predetermined commands that must be applied in a defined chronological order. However, a series of functions and commands which are allowed during proper operation of the component are desired or allowed chronologically only after the initialization sequence. According to the JEDEC standard for SDRAM semiconductor memories, a recommended initialization sequence (so-called "POWERON-SEQUENCE") is provided as follows:

a) the application of a supply voltage and a start pulse in order to bring about an NOP condition at inputs of the component;

b) the maintenance of a stable supply voltage of a stable clock signal, and of stable NOP input conditions for a minimum time period of 200 $\mu$s;

c) the preparation command for word line activation (PRECHARGE) for all the memory banks of the device;

d) the activation of two or more refresh commands (AUTOREFRESH); and 4) the activation of the loading configuration register command (MODE-REGISTER-SET) for initializing the mode register.

After the identification of such a defined initialization sequence, the memory module is normally in a so-called IDLE state, that is to say it is precharged and prepared for proper operation. In the case of the SDRAM semiconductor memory modules that have been disclosed to date, all the control circuits of the component have been unlatched only with the POWERON signal. The signal POWERON is active if the internal supply voltages have reached the necessary values that are necessary for the proper operation of the component. The module is then in a position to recognize and execute instructions.

SUMMARY OF THE INVENTION

It is accordingly an object of the invention to provide a dynamic semiconductor memory device and a method for initializing a dynamic semiconductor memory device which overcomes the above-mentioned disadvantages of the prior art methods and devices of this general type, which is as simple as possible in structural terms in the control of the switch-on operation in dynamic semiconductor memory devices of the random access type (DRAM or SDRAM), and which effectively prevents the risk of a short circuit of the data lines and/or of uncontrolled activation of internal current loads.

With the foregoing and other objects in view there is provided, in accordance with the invention, a dynamic semiconductor memory device of a random access type, including an initialization circuit controlling a switch-on operation and supplying a supply voltage stable signal once a supply voltage has been stabilized after a start of the switch-on operation. The initialization circuit has a control circuit for controlling operations and an advance detector circuit detecting a predetermined level state of an externally applied clock control signal chronologically before a generation of the supply voltage stable signal and in response to the externally applied clock control signal the advance detector circuit supplying an enable signal for unlatching said control circuit.

The object is achieved by a dynamic semiconductor memory device which supplies a further or second enable signal (CHIPREADY) for controlling the switch-on operation of such a semiconductor memory device.

The invention provides for the initialization circuit to have an advance detector circuit, which detects a predetermined level state of an externally applied clock control signal (CKE) chronologically before the supply voltage stable signal (POWERON) and, as a reaction to a first level change (L-H transition), supplies a first enable signal for unlatching the control circuit provided for the proper operation of the semiconductor memory device. In particular, by the initialization circuit according to the invention, the first level change of the clock control signal (CKE) to the logic HIGH state, that is to say the active state, is detected and the first enable signal is output as a reaction. The clock control signal (CKE) is normally at the logic level state LOW, that is to say the inactive state, from the outset. The invention results in the earliest possible detection of the level change of the clock control signal (CKE) to logic HIGH. The level change, together with the activation of the supply voltage stable signal POWERON from inactive to active (active state=logic "HIGH") and the proper initialization sequence, effecting the triggering of the second enable signal CHIPREADY. As a result, the advance detector circuit is in a position, even before the provision of the POWERON signal by other circuit sections of the semiconductor chip, to identify the predetermined level, in particular the LOW level, of the clock control signal (CKE).

According to a particularly preferred embodiment of the invention, the clock control signal is to be understood to be the signal CKE ("input-clock-enable") in the case of synchronous DRAM memory components, which signal, as is known, serves to activate the CLK signal ("input-clock"= master-clock-signal) if CKE=HIGH, and to deactivate it if CKE LOW. As is known, the POWERDOWN mode, the SELF-REFRESH mode or the SUSPEND mode is initialized by deactivation of the clock signal, that is to say CKE=LOW.

The signal POWERON indicates the provision of all the on-chip supply voltages in a manner known per se.

Following the principle of the invention, in addition to the regular receiver circuit that is provided in any case in the initialization circuit and is normally operated with a reference voltage, an additional receiver circuit or advance detector circuit is provided. The additional receiver circuit is operated independently of a reference voltage and remains permanently switched on at least during the POWERUP phase of the memory component. The additional receiver circuit is thus in a position to detect the first transition to the logic HIGH state, that is to say active state (in general: a predetermined level state), of the clock control signal CKE early on during the switch-on operation of the semiconductor memory device (POWERUP phase), to be precise even before the supply voltage stable signal POWERON changes from inactive to active. With the inactive state of the clock control signal CKE, the first enable signal supplied by the additional advance detector circuit latches the second enable signal CHIPREADY. Since the command signals (inter alia CS, RAS, CAS, WE) externally applied to the semiconductor memory device are undefined during the switch-on operation (POWERUP), this prevents the initialization sequence from being run through randomly and the second enable signal CHIPREADY thus becoming active prematurely. In the course of the POWERUP sequence, the internal voltages reach their defined threshold values and the supply voltage stable signal POWERON becomes active. When the clock control signal CKE changes to the active state for the first time, the latching of the second enable signal CHIPREADY is canceled with CKE=active and POWERON=active. This happens only in the event of the first CKE transition to logic HIGH, since the first enable signal passes to a corresponding flip-flop input of the enable circuit. Afterwards, the CKE signal with the first enable signal can toggle without there being any further influence on the second enable signal CHIPREADY. According to an expedient development of the invention, the identification of this first CKE transition to logic HIGH is one of the conditions for the activation of the second enable signal CHIPREADY. The further conditions of the activation of the second enable signal CHIPREADY are defined in the initialization sequence, as before. The second enable signal CHIPREADY is conducted into the output buffer control logic unit, where it latches the OCD circuits (OCD=off chip driver). Consequently, the activation of the CHIPREADY signal presupposes the logic HIGH level of the POWERON signal. Starting from the instant from which the POWERON signal is at logic HIGH, the first transition from LOW to HIGH or the first HIGH level of the CKE signal is evaluated.

According to an advantageous refinement of the invention, the second enable signal CHIPREADY is generated and becomes active in dependence on further internal signals and the initialization sequence and then unlatches predetermined circuits. The predetermined circuits remain latched until the end of the predetermined initialization sequence. By way of example, commands are decoded but not executed and the output drivers are held at high impedance.

According to the preferred application in SDRAM memory devices according to the JEDEC standard (for example according to the internationally valid JEDEC standard JC-16-97-58A item No. 53 for SDRAM memory components), it is provided that the command signals—externally applied to the semiconductor memory device—of the initialization sequence to be identified by the enable circuit have the preparation command for word line activation (PRECHARGE), and/or the refresh command (AUTOREFRESH), and/or the loading configuration register command (MODE-REGISTER-SET).

According to an advantageous structural refinement of the initialization circuit according to the invention, it is provided that the enable circuit has bistable multivibrator stages with a respective set input. The bistable multivibrator stages receive a command signal (PRECHARGE, AUTOREFRESH, MODE-REGISTER-SET) when the clock control signals CKE is applied. The bistable multivibrator stages each have a respective reset input, to which the supply voltage stable signal (POWERON) or a signal derived therefrom or a linked signal is applied, and have a respective output, at which the further or second enable signal (CHIPREADY) is derived.

Other features which are considered as characteristic for the invention are set forth in the appended claims.

Although the invention is illustrated and described herein as embodied in a dynamic semiconductor memory device and a method for initializing a dynamic semiconductor memory device, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection is with the accompanying drawings.

DESCRIPTION OF THE PREFERRED EMBODIMENTS

Figure 1:
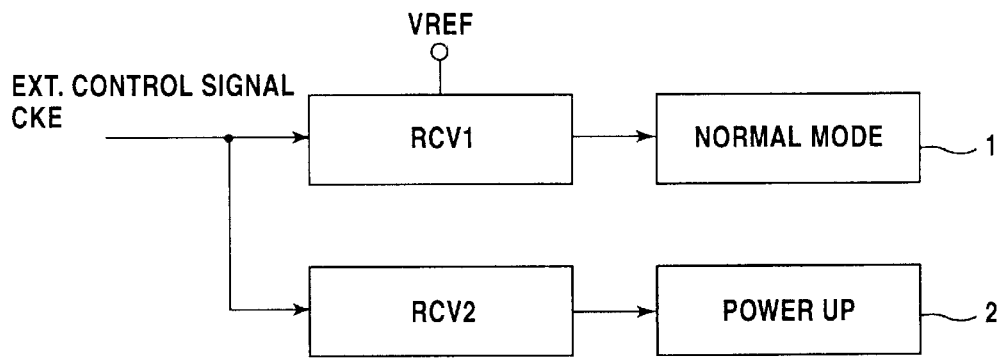
FIG. 1 is a diagrammatic, block diagram of components of an initialization circuit which controls a switch-on operation of a semiconductor memory and its circuit components according to the invention.

In all the figures of the drawing, sub-features and integral parts that correspond to one another bear the same reference symbol in each case. Referring now to the figures of the drawing in detail and first, particularly, to FIG. 1 thereof, there is shown a number of components of an initialization circuit which controls the switch-on operation of an SDRAM memory device operating according to the JEDEC standard and its circuit components. The initialization circuit includes a regular receiver circuit RCV1 that operates with an internal or else an external reference voltage VREF and is fed with a regular supply voltage, a normal mode logic circuit 1 connected downstream of the regular receiver circuit RCV1, and also a separate advance detector circuit RCV2, additionally provided in addition to the regular receiver circuit RCV1, and a POWERUP logic circuit 2 connected downstream of the advance detector circuit RCV2. A clock control signal CKE=CLOCK-ENABLE signal externally applied to the semiconductor memory device is fed to the input both of the circuit RCV1 and of the circuit RCV2. In the previously known dynamic semiconductor memory devices, the external CKE signal is only detected by. the receiver circuit RCV1 and forwarded to the normal logic unit 1. The regular receiver circuit RCV1 operates with a reference voltage VREF, which is normally stabilized only after the conclusion of the switch-on operation. For this reason, the instant of the POWERUP phase at which the regular receiver circuit RCV1 operates stably is not defined. In order, nevertheless, to identify an externally applied clock control signal CKE in a stable fashion as early as possible, the invention provides the additional receiver circuit RCV2, which manages without a reference voltage and consequently is not suitable for detecting the external signal in principle, that is to say during the normal operating mode of the DRAM memory. The additional receiver circuit RCV2 is suitable, however, for detecting the CKE signal at the beginning of the POWERUP phase after an internal supply voltage VINT has reached a specific value. The additional receiver circuit RCV2 is thus in a position to detect a defined CKE signal even before the reference voltage VREF is stable.

Figure 2:
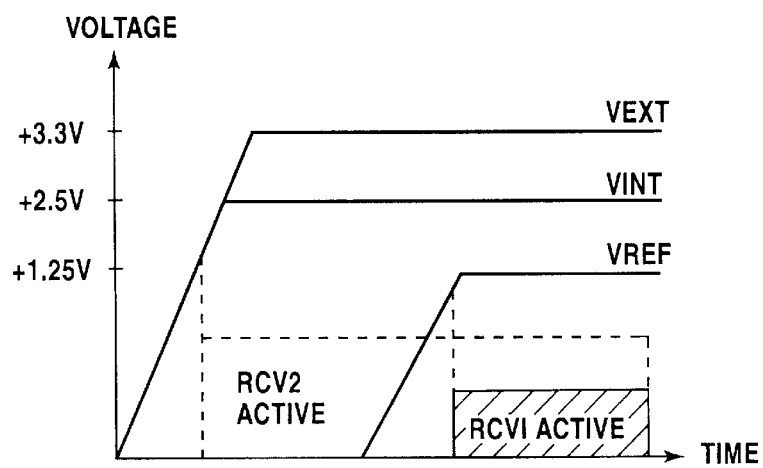
FIG. 2 is a time sequence diagram for elucidating a method of operation of the circuit according to FIG. 1.

The method of operation of the circuit illustrated schematically in FIG. 1 is revealed according to FIG. 2. It is evident that the receiver circuit RCV2 operates long before the regular receiver circuit RCV1 becomes active after stabilization of the reference voltage VREF to a value of approximately +1.25 V.

The internal supply voltage VINT is approximately +2.5 V, and the external supply voltage VEXT is approximately +3.3 V. The time that elapses from the beginning of the functional capability of the additional receiver circuit RCV2 until the beginning of operation of the regular receiver circuit RCV1 is typically a few μs.

The regular receiver circuit RCV1 may advantageously constitute a differential amplifier circuit, which is familiar to a person skilled in the art and, therefore, need not be explained in any further detail. The additional receiver circuit RCV2 may advantageously be an inverter circuit having comparatively simple circuitry. The inverter circuit operating without a reference voltage and functioning with an auxiliary supply voltage that is lower than the internal supply voltage VINT.

Figure 3:
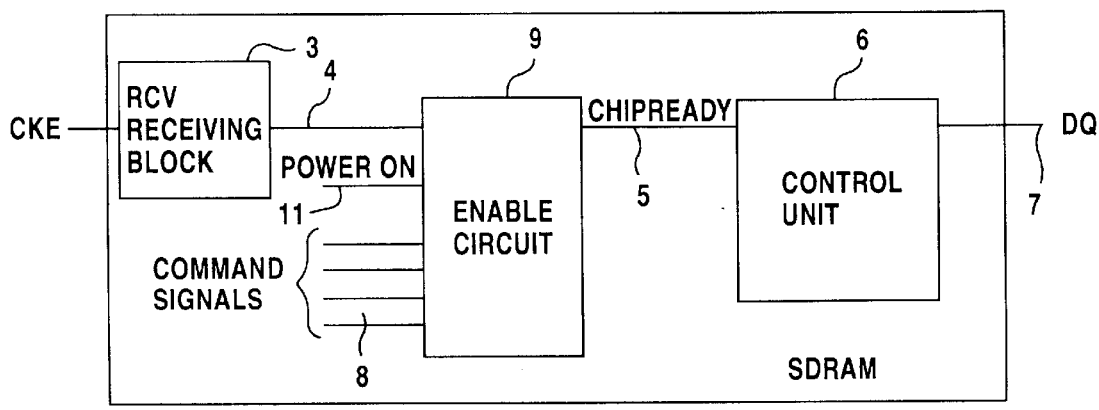
FIG. 3 is a block diagram of the circuit components of an DRAM memory according to the JEDEC standard.

FIG. 3 shows further details of the initialization circuit that controls the switch-on operation of the semiconductor memory device and its circuit components. The initialization circuit includes an RCV switching block 3, which contains inter alia the circuits RCV1, RCV2, 1 and 2 illustrated in FIG. 1, an enable circuit 9, to whose input 8 are applied command signals, to be input into the semiconductor memory externally, after amplification and conditioning effected by a command decoder (not specifically illustrated), inter alia command signals PRE or PRECHARGE (preparation command for word line activation), ARF or AUTOREFRESH (refresh command) and MRS or MODE-REGISTER-SET (loading configuration register command) being applied to the input 8 of the enable circuit 9. Not specifically illustrated is a regulating circuit, known per se, for the internal voltage regulation and/or detection, at whose input the external supply voltages that are applied to the semiconductor memory externally are fed in, and at one of whose outputs the POWERON signal is supplied and at whose other output the stabilized internal supply voltages are supplied. What is important for understanding the invention is the fact that the regulating circuit supplies an active POWERON signal if, after the POWERUP phase of the SDRAM memory, the internal supply voltages present at one output of the regulating circuit have reached the values necessary for proper operation of the component.

According to the embodiment of the invention in accordance with FIG. 3, the initialization circuit has the enable circuit 9 connected downstream of the regulating circuit and the RCV circuit 3, inter alia the command signals PRE, ARF and MRS being applied to the input 8 of the enable circuit 9. The POWERON signal from the regulating circuit is applied to the input 11 of the enable circuit 9. The first enable signal derived from the external clock control signal CKE as described above is applied to the input 4 of the enable circuit 91 and a second enable signal CHIPREADY is supplied at an output 5 of the enable circuit 9 after the identification of a predetermined proper initialization sequence of the command signals applied to the semiconductor memory device. The second enable signal effects unlatching of the control circuit 6 provided for proper operation of the semiconductor memory device. The internal control signal serves inter alia for sequence control for one or more of the memory blocks (not specifically illustrated) of the SDRAM memory and are known as such. An output 7 of the control circuit 6 passes onto data lines DQ of the SDRAM module.

The method of operation of the circuit illustrated in FIG. 3 is as follows. The clock control signal CKE fed into the semiconductor memory device externally is detected by the RCV circuit block 3 and forwarded to the input 4 of the enable circuit 9. In the enable circuit 9, the command signals present at the input 8 are ignored until the external clock control signal CKE changes to a voltage level of logic HIGH. If the clock control signal CKE is at the voltage level of logic HIGH, then the command signals are interrogated with regarded ti a proper initialization sequence. As soon as a proper initialization sequence is detected, the second enable signal CHIPREADY changes to the voltage level of logic HIGH and the output drivers are enabled as a consequence of this.

The possible signal states are revealed here using the overview table below:

| CKE | POWERON | Initialization sequence | CHIPREADY | DQ |
|---|---|---|---|---|
| 0 | 0 | No | 0 | Z (= tristate |
| 0 | 0 | Yes | 0 | Z |
| 0 | 1 | No | 0 | Z |
| 0 | 1 | Yes | 0 | Z |
| 1 | 0 | No | 0 | Z |
| 1 | 0 | Yes | 0 | Z |
| 1 | 1 | No | 0 | Z |
| 1 | 1 | Yes | 1 | Z or active |

Figure 4:
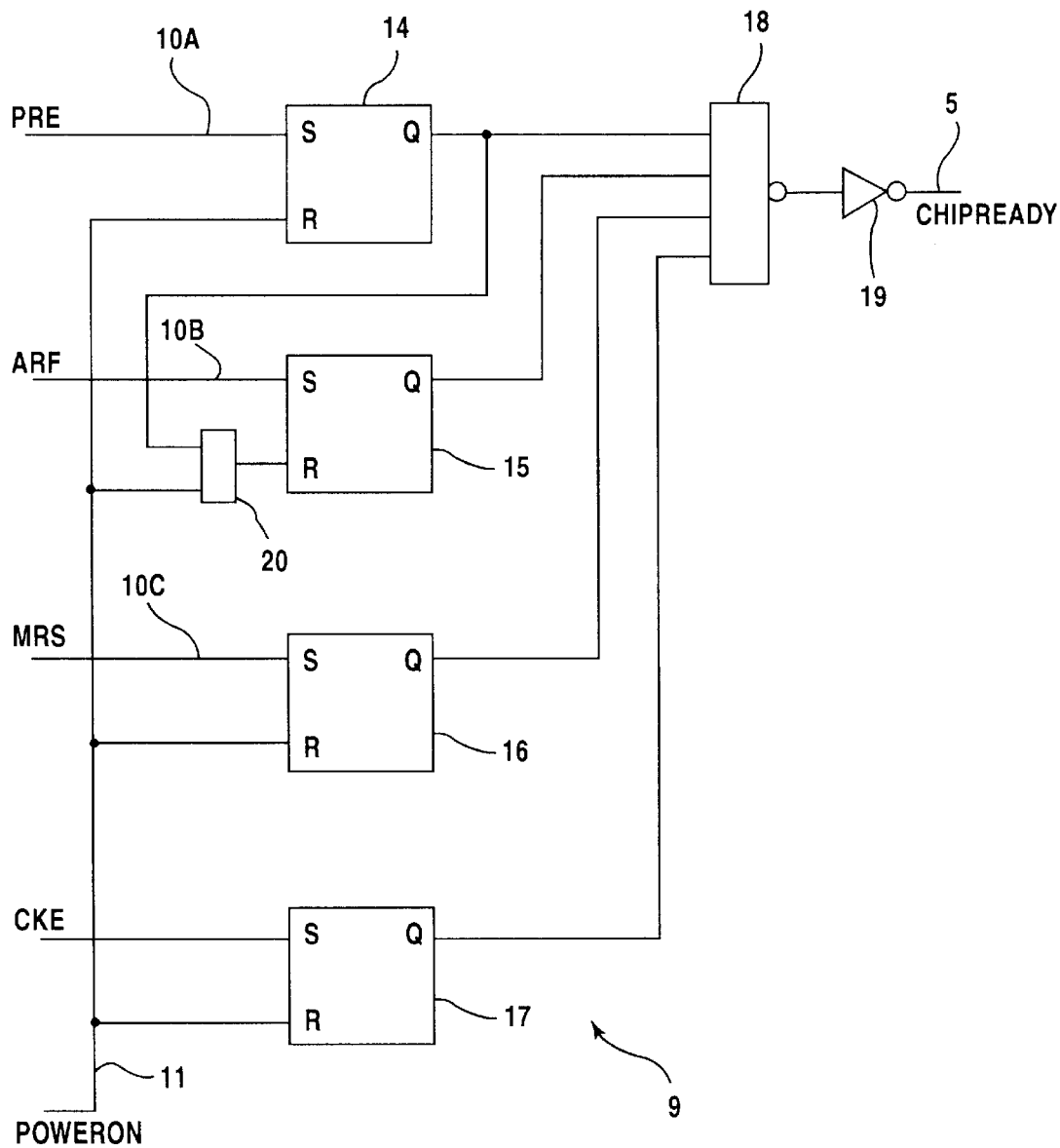
FIG. 4 is a block circuit diagram of an enable circuit which supplies a second enable signal (CHIPREADY)

FIG. 4 shows a preferred exemplary embodiment of the enable circuit 9 according to the invention. The enable circuit contains four bistable multivibrator stages 14, 15, 16 and 17 each having a set input S, a reset input R, and also an output Q. An AND gate 20 is connected upstream of the reset input R of the multivibrator stage 15. A NAND gate 18 is connected downstream of all the outputs Q of the multivibrator stages 14, 15, 16, 17 and an inverter 19 is connected downstream of the NAND gate 18. The enable signal CHIPREADY is output at the output 5 of the inverter 19, the enable signal CHIPREADY being active HIGH, that is to say activated when its voltage level is at logic HIGH. The command signals PRE, ARF, MRS applied to the respective set inputs S of the bistable multivibrator stages 14, 15, 16 are each active LOW, that is to say these signals are active when their voltage level is at logic LOW, while the POWERON signal is again active HIGH. The clock control signal CKE or a signal derived directly from this is applied to the set input S of the bistable multivibrator stage 17, and the output Q of the multivibrator stage 17 is in turn applied to an input of the NAND gate 18. The POWERON signal is applied directly to the reset inputs R in the case of the multivibrator stages 14 and 16 and is firstly applied to one input of the AND gate 20 in the case of the multivibrator stage 15. The signal output from the output Q of the multivibrator stage 14 is applied to the other input of the AND gate and the output of the AND gate 20 is connected to the reset input of the multivibrator stage 15.

The method of operation of the enable circuit 9 illustrated in FIG. 4 is such that activation of the enable signal CHIPREADY at the output 5 to logic HIGH is generated only when a predetermined chronological initialization sequence of the command signals PRE, ARF and MRS and activation of the POWERON signal to the logic level HIGH are detected. Only then are the control circuits unlatched on account of the activation of the enable signal CHIPREADY; these circuits remain latched prior to this.

Figure 5:
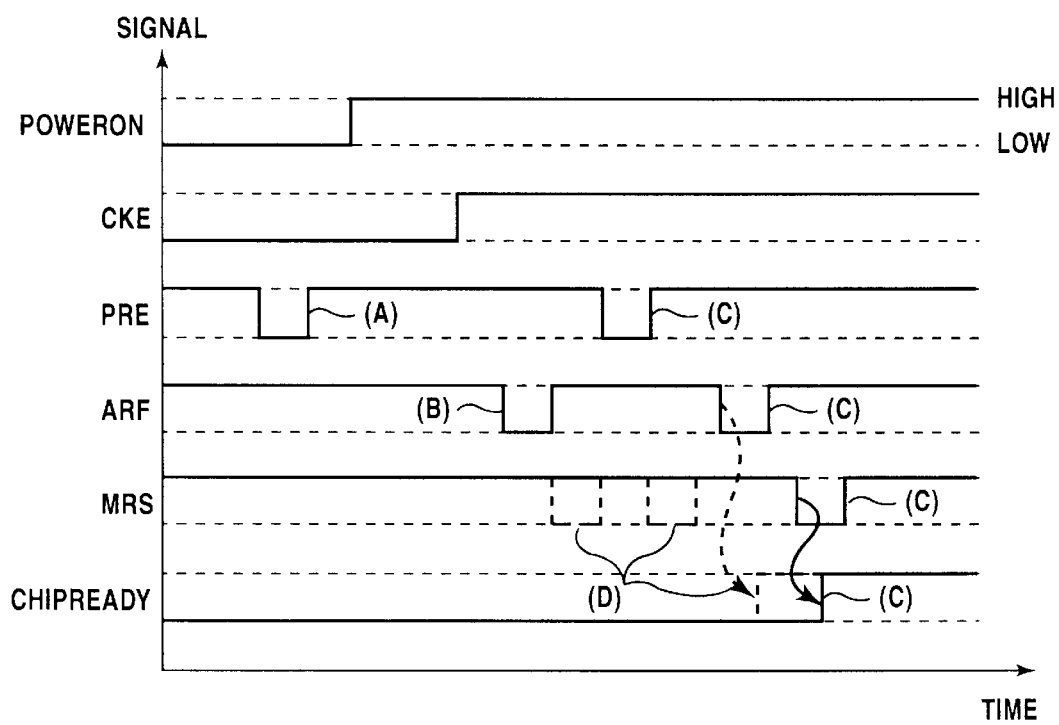
FIG. 5 is a time sequence diagram for elucidating the method of operation of the circuit according to FIG. 4.

In the schematic time sequence diagram according to FIG. 5, exemplary command sequences during the switch-on operation of the semiconductor memory device are illustrated in order to elucidate the method of operation of the enable circuit 9.

In the case situation A, the signal PRECHARGE is activated to active LOW too early relative to the activation of the POWERON signal, with the result that, the enable signal CHIPREADY is not yet activated since the proper initialization sequence requires a waiting time before the first command. The signal swing of the command PRECHARGE according to case situation A is thus correctly ignored. In case situation B, the chronological order of the activation of the signal AUTOREFRESH to logic LOW is incorrect since the proper initialization sequence prescribes a previous PRECHARGE command before the AUTOREFRESH command. The signal swing of the AUTOREFRESH signal to logic LOW according to case situation B is therefore likewise ignored, and the enable signal CHIPREADY does not go to logic HIGH. In case situation C, a correct chronological order of the commands PRECHARGE, AUTOREFRESH, MODE-REGISTER-SET is present, conforming to the JEDEC standard. In a logically consistent manner, since the POWERON signal is also at logic HIGH, the enable signal CHIPREADY at logic HIGH is now supplied. Illustrated using dashed lines, another further conceivable initialization sequence that is allowed and therefore triggers an enable signal is represented by the symbol D; activation of the command MODE-REGISTER-SET to logic LOW is allowed at any time after the activation of the POWERON signal.

For further details relating to the method of operation and configuration of the enable circuit 9, reference is made to the entire contents of the patent application applied for by the same applicant, filed on the same application date, entitled "Dynamic Semiconductor Memory Device of the Random Access Type" and having the docket number GR 98 E 1796 of the applicant, and is hereby incorporated by reference.

We claim:

1. A dynamic semiconductor memory device of a random access type, comprising:
an initialization circuit controlling a switch-on operation and supplying a supply voltage stable signal once a supply voltage has been stabilized after a start of the switch-on operation, said initialization circuit having a control circuit for controlling operations and an advance detector circuit detecting a predetermined level state of an externally applied clock control signal chronologically before a generation of the supply voltage stable signal and in response to the externally applied clock control signal said advance detector circuit supplying an enable signal for unlatching said control circuit.

2. The dynamic semiconductor memory device according to claim 1, wherein said advance detector circuit operates independently of a reference voltage.

3. The dynamic semiconductor memory device according to claim 1, wherein the externally applied clock control signal constitutes a clock-enable signal.

4. The dynamic semiconductor memory device according to claim 1, wherein said initialization circuit has a regular receiver circuit and said advance detector circuit is a separate, additional auxiliary receiver circuit in addition to said regular receiver circuit, said additional auxiliary receiver circuit operating in an event the supply voltage is lower than a normal supply voltage.

5. The dynamic semiconductor memory device according to claim 1, wherein said advance detector circuit remains permanently switched on during the switch-on operation and is only switched off as soon as the predetermined level state of the externally applied clock control signal has been detected.

6. The dynamic semiconductor memory device according to claim 4, wherein said regular receiver circuit is a differential amplifier circuit and said additional auxiliary receiver circuit is an inverter circuit.

7. The dynamic semiconductor memory device according to claim 1, wherein said initialization circuit has an enable circuit receiving the supply voltage stable signal and externally applied further command signals, said enable circuit supplying a further enable signal after receiving and identifying a predetermined proper initialization sequence of the further command signals, the further enable signal effecting an unlatching of said control circuit.

8. The dynamic semiconductor memory device according to claim 7, wherein the further enable signal is not activated until a level change in the externally applied clock control signal is detected by said advance detector circuit.

9. The dynamic semiconductor memory device according to claim 7, wherein said further command signals are externally applied command signals having an initialization sequence to be identified by said enable circuit and include at least one of a preparation command for word line activation, a refresh command, and a loading configuration register command.

10. The dynamic semiconductor memory device according to claim 7, wherein said enable circuit has at least one bistable multivibrator stage with a set input receiving one of said further command signals and a reset input receiving one of the supply voltage stable signal, a signal derived from the supply voltage stable signal, and a linked signal, said at least one bistable multivibrator stage having an output for outputting the further enable signal.

11. The dynamic semiconductor memory device according to claim 9, wherein the determined proper initialization sequence identified as a proper initialization sequence by said enable circuit and triggers the further enable signal constitutes a command sequence conforming to a JEDEC standard.

12. The dynamic semiconductor memory device according to claim 7, wherein said control circuit has output drivers remaining latched during the switch-on operation until the further enable signal supplied by said enable circuit is active.

13. The dynamic semiconductor memory device according to claim 9, wherein the predetermined proper initialization sequence for effecting a triggering of the further enable signal includes one of the following chronologically successive command sequences:

a) firstly PRE, secondly ARF, thirdly MRS;

b) firstly PRE, secondly MRS, thirdly ARF; and c) firstly MRS, secondly PRE, or thirdly ARF;

where the abbreviations designate the following commands:

PRE=the preparation command for word line activation,

ARF=the refresh command, and

MRS=the loading configuration register command.

14. A method for detecting an externally applied control signal in a monolithically integrated dynamic semiconductor memory device of a random access type during a switch-on operation of the dynamic semiconductor memory device, which comprises:

using an auxiliary receiver circuit in addition to a regular receiver circuit; and operating the auxiliary receiver circuit in an event of a supply voltage lower than a normal supply voltage.

15. An improved method for initializing a dynamic semiconductor memory device of a random access type via an initialization circuit controlling a switch-on operation of the dynamic semiconductor memory device and of its circuit components and the initialization circuit supplying a supply voltage stable signal once a supply voltage has been stabilized after the switch-on operation of the dynamic semiconductor memory device, the improvement which comprises:

providing the initialization circuit with an advance detector circuit for detecting a predetermined level state of an externally applied clock control signal chronologically before the supply voltage stable signal and supplying an initial enable signal for unlatching a control circuit provided for a proper operation of the dynamic semiconductor memory device.

16. The method according to claim 15, which comprises generating and supplying a further enable signal via an enable circuit of the initialization circuit, the further enable signal derived from the supply voltage stable signal and to further command signals externally applied to the dynamic semiconductor memory device after an identification of a predetermined proper initialization sequence of the further command signals applied, the further enable signal effecting the unlatching of the control circuit.

17. The method according to claim 16, which comprises providing the further command signals with at least one of a preparation command for word line activation signal, a refresh command signal, and a loading configuration register command signal.

18. The method according to claim 17, which comprises keeping output drivers of the dynamic semiconductor memory device latched during the switch-on operation until the generation of the further enable signal supplied by the enable circuit.

19. The method according to claim 15, which comprises using an enable circuit for supplying a further enable signal for controlling the switch-on operation of the dynamic semiconductor memory device.

* * * * *